US012663701B2

(12) United States Patent
Dai et al.

(10) Patent No.: US 12,663,701 B2
(45) Date of Patent: Jun. 23, 2026

(54) PROJECTION DEVICE HAVING STOPPER WALL STRUCTURE

(71) Applicant: Coretronic Corporation, Hsin-Chu (TW)

(72) Inventors: Meng-Syuan Dai, Hsin-Chu (TW); Wen-Hao Chu, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 720 days.

(21) Appl. No.: 17/878,913

(22) Filed: Aug. 2, 2022

(65) Prior Publication Data

US 2023/0040297 A1    Feb. 9, 2023

(30) Foreign Application Priority Data

Aug. 4, 2021    (CN) .......................... 202121805137.6

(51) Int. Cl.
*G03B 21/16*        (2006.01)
*H05K 7/20*         (2006.01)

(52) U.S. Cl.
CPC ......... *G03B 21/16* (2013.01); *H05K 7/20145* (2013.01)

(58) Field of Classification Search
CPC .............................. G03B 21/16; H05K 7/20145
USPC ........................................................... 353/57
See application file for complete search history.

(56) References Cited

U.S. PATENT DOCUMENTS

| | | | | |
|---|---|---|---|---|
| 8,303,118 B2 * | 11/2012 | Minami | ................. | G03B 21/16 |
| | | | | 353/57 |
| 2005/0122721 A1 * | 6/2005 | Hori | ........................ | F21V 29/83 |
| | | | | 362/268 |

| | | | | |
|---|---|---|---|---|
| 2006/0146293 A1 * | 7/2006 | Morimoto | .............. | G03B 21/16 |
| | | | | 353/61 |
| 2006/0187420 A1 * | 8/2006 | Wei | ......................... | G03B 21/16 |
| | | | | 353/61 |
| 2009/0195757 A1 * | 8/2009 | Chen | ....................... | G03B 21/16 |
| | | | | 353/58 |
| 2009/0207382 A1 * | 8/2009 | Hsiao | ...................... | G03B 21/16 |
| | | | | 353/58 |
| 2014/0092368 A1 * | 4/2014 | Dai | ......................... | G03B 21/16 |
| | | | | 353/58 |

FOREIGN PATENT DOCUMENTS

| | | |
|---|---|---|
| CN | 208188559 | 12/2018 |
| CN | 214540347 | 10/2021 |
| TW | 201104339 | 2/2011 |
| TW | 201600916 | 1/2016 |

* cited by examiner

*Primary Examiner* — Magda Cruz
(74) *Attorney, Agent, or Firm* — JCIPRNET

(57)                    ABSTRACT

A projection device includes a housing, a projection module, a fan, and at least one stopper wall structure. The housing has an air inlet, a first air outlet, and at least one second air outlet. The fan has a wind outlet facing the first air outlet. One part of the projection module is located between the wind outlet and the first air outlet, and one part of a heat dissipating airflow provided by the fan flows from the wind outlet to the first air outlet. The stopper wall structure is connected to the fan, and the stopper wall structure and one part of the housing define at least one air guiding channel. The other part of the projection module is located in the air guiding channel, and the other part of the heat dissipating airflow is guided by the air guiding channel to flow toward the second air outlet.

17 Claims, 6 Drawing Sheets

PROJECTION DEVICE HAVING STOPPER WALL STRUCTURE

CROSS-REFERENCE TO RELATED APPLICATION

This application claims the priority benefit of China patent application serial no. 202121805137.6, filed on Aug. 4, 2021. The entirety of the above-mentioned patent application is hereby incorporated by reference herein and made a part of this specification.

BACKGROUND OF THE INVENTION

Field of the Invention

The invention relates to a projection device; more particularly, the invention relates to a projection device including a fan.

Description of Related Art

Due to internal configuration and considerations of optical path design, internal components of a projection device are separated at different locations, and therefore it may be difficult to effectively dissipate heat from each component and a heat dissipation module by a heat dissipating airflow generated by one single fan. Accordingly, in some projection devices, additional fans are disposed at specific components with high temperature to directly provide the heat dissipating airflow; what is more, these components with high temperature may even be equipped with corresponding air guiding masks and/or additional openings on the housing around these components to bring more airflow. However, the design with the additional fan and the corresponding air guiding masks may increase a volume of the projection device and raise the manufacturing cost.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention was acknowledged by a person of ordinary skill in the art.

SUMMARY OF THE INVENTION

This invention provides a projection device capable of applying one single fan to effectively dissipate heat from a plurality of separate components.

Other objectives and advantages of the invention may further be learned from technical features disclosed in the invention.

In order to achieve one or a part or all of the foregoing objectives or other objectives, an embodiment of the invention provides a projection device including a housing, a projection module, a fan, and at least one stopper wall structure. The housing has an air inlet, a first air outlet, and at least one second air outlet. The projection module is disposed in the housing. The fan is disposed in the housing, and the fan has a wind outlet, the wind outlet faces the first air outlet, one part of the projection module is located between the wind outlet and the first air outlet, and one part of a heat dissipating airflow provided by the fan flows from the wind outlet to the first air outlet. One part of the at least one stopper wall structure is connected to the fan, and the at least one stopper wall structure and one part of the housing define at least one air guiding channel. The other part of the projection module is located in the at least one air guiding channel, and the other part of the heat dissipating airflow is guided by the at least one air guiding channel to flow toward the at least one second air outlet.

In view of the above, the at least one stopper wall structure connected to the fan is disposed in the projection device according to one or more embodiments of the invention to define the at least one air guiding channel between the at least one stopper wall structure and the housing. The heat dissipating airflow provided by the fan not only flows directly toward the first air outlet to dissipate heat from one part of the projection module between the fan and the first air outlet, but also flows along the at least one air guiding channel toward the at least one second air outlet to dissipate heat from the other part of the projection module in the at least one air guiding channel. Thereby, one single fan applied in one or more embodiments of the invention is capable of dissipating heat from a plurality of separate components of the projection module.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
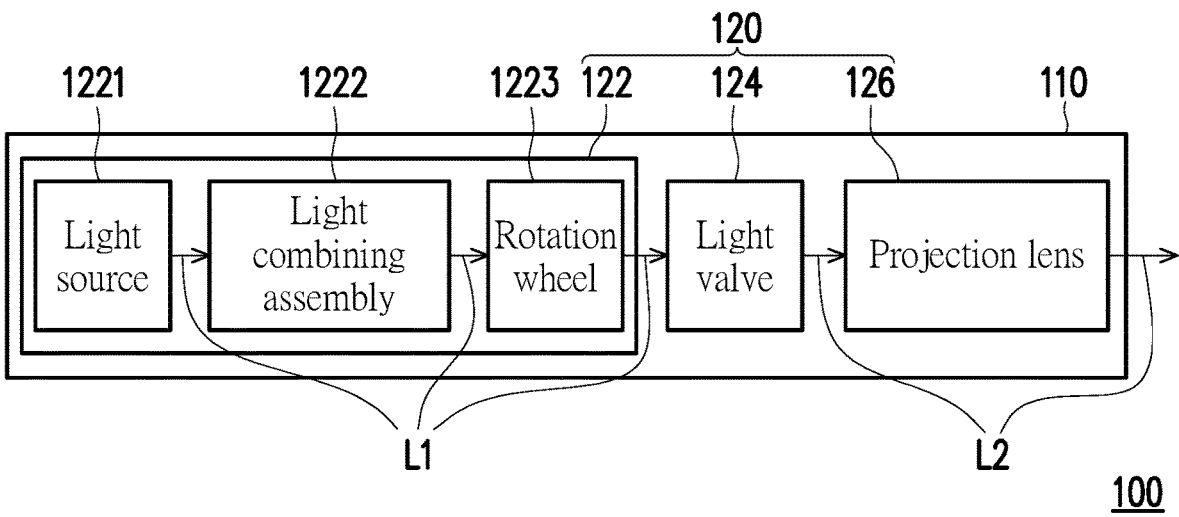
FIG. 1 is a schematic view of a projection device according to an embodiment of the invention.
Figure 2:
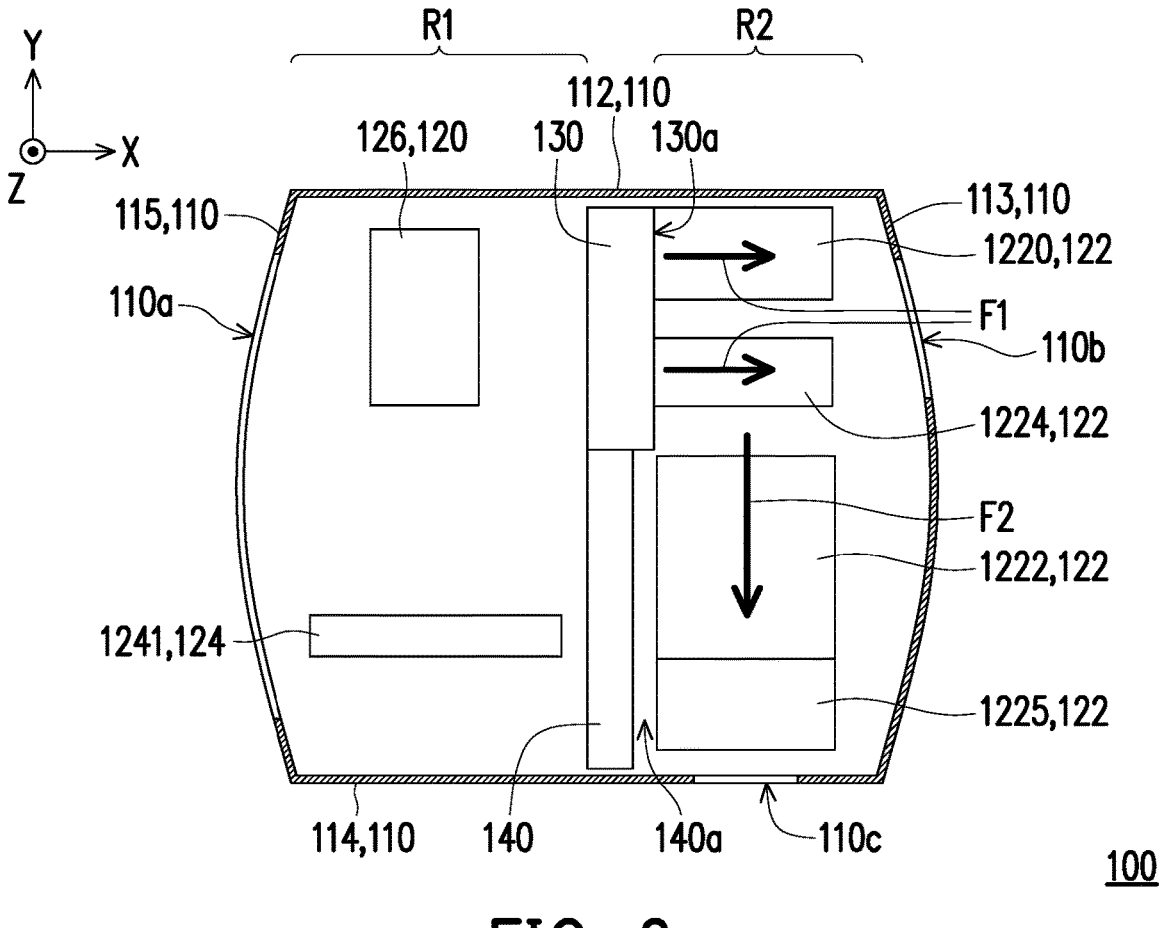
FIG. 2 is a top view of a partial structure of the projection device shown in FIG. 1.

FIG. 1 is a schematic view of a projection device according to an embodiment of the invention. FIG. 2 is a top view of a partial structure of the projection device shown in FIG. 1. Please refer to FIG. 1 and FIG. 2. A projection device 100 provided in this embodiment includes a housing 110 and a projection module 120. The projection module 120 is disposed in the housing 110, and the projection module 120 includes a light source module 122, a light valve 124, and a projection lens 126. The light source module 122 is configured to provide an illumination beam L1, the light valve 124 is configured to convert the illumination beam L1 to an image beam L2, and the projection lens 126 is configured to project the image beam L2 out of the housing 110.

The light source module 122 includes a driving board 1220, a light source 1221, a light combining assembly 1222, a rotation wheel 1223, a first heat dissipating structure 1224, and a second heat dissipating structure 1225. The driving board 1220 is connected to the light source 1221 and is configured to drive the light source 1221. The light source 1221 is, for example, a laser diode (LD), and the light source 1221 is configured to provide the illumination beam L1 (excitation beam), and the illumination beam L1 (excitation beam) is sequentially transmitted to the light combining assembly 1222 and the rotation wheel 1223, and the illumination beam L1 (for example, including at least one of the excitation beam and the conversion beam) from the rotation wheel 1223 is transmitted toward the light valve 124. The first heat dissipating structure 1224 and the second heat dissipating structure 1225 are, for example, a heat dissipating fin group corresponding to the light source 1221 and a heat dissipating fin group corresponding to the rotation wheel 1223, respectively, and the first heat dissipating structure 1224 and the second heat dissipating structure 1225 are connected to the light source 1221 and the rotation wheel 1223, respectively. The rotation wheel 1223 is, for example, a phosphor wheel. For example, a combination of the light source 1221 and the rotation wheel 1223 may be configured to provide a beam with a different wavelength (color) as a source of the illumination beam L1.

Please refer to FIG. 2. The housing 110 has an air inlet 110a, a first air outlet 110b, and a second air outlet 110c. The projection device 110 further includes a fan 130 disposed in the housing 110. The fan 130 has a wind outlet 130a, and the wind outlet 130a faces the first air outlet 110b. One part of the light source module 122 of the projection module 120 (e.g., the driving board 1220 and the first heat dissipating structure 1224) is located between the wind outlet 130a and the first air outlet 110b, and one part of a heat dissipating airflow provided by the fan 130 (shown as a heat dissipating airflow F1) flows from the wind outlet 130a to the first air outlet 110b.

In addition, the projection device 100 further includes a stopper wall structure 140. The stopper wall structure 140 is connected to the fan 130, and the stopper wall structure 140 extends from a side of the fan 130, and an extension direction of the stopper wall structure 140 is, for example, perpendicular to a wind output direction of the fan 130 (i.e., a direction shown by the heat dissipating airflow F1). The fan 130 and the stopper wall structure 140 divide the housing 110 into a first region R1 and a second region R2. The air inlet 110a, the projection lens 126, the light valve 124, and a third heat dissipating structure 1241 of the light valve 124 are located in the first region R1, and the first air outlet 110b, the second air outlet 110c, and the light source module 122 are located in the second region R2. The stopper wall structure 140 and one part of the housing 110 define an air guiding channel 140a. The other part of the light source module 122 of the projection module 120 (e.g., the light combining assembly 1222 and the second heat dissipating structure 1225) is located in the air guiding channel 140a. The other part of the heat dissipating airflow provided by the fan 130 (shown as a heat dissipating airflow F2) is guided by the air guiding channel 140a to flow toward the second air outlet 110c.

As mentioned above, the heat dissipating airflow provided by the fan 130 not only flows directly toward the first air outlet 110b (e.g., the heat dissipating airflow F1) to dissipate heat from one part of the projection module 120 (e.g., the driving board 1220 and the first heat dissipating structure 1224) between the fan 130 and the first air outlet 110b, but also flows along the air guiding channel 140a toward the second air outlet 110c (e.g., the heat dissipating airflow F2) to dissipate heat from the other part of the projection module 120 (e.g., the light combining assembly 1222 and the second heat dissipating structure 1225) in the air guiding channel 140a. Thereby, one single fan 130 applied in this embodiment of the invention is capable of dissipating heat from a plurality of separate components of the projection module 120.

Figure 3:
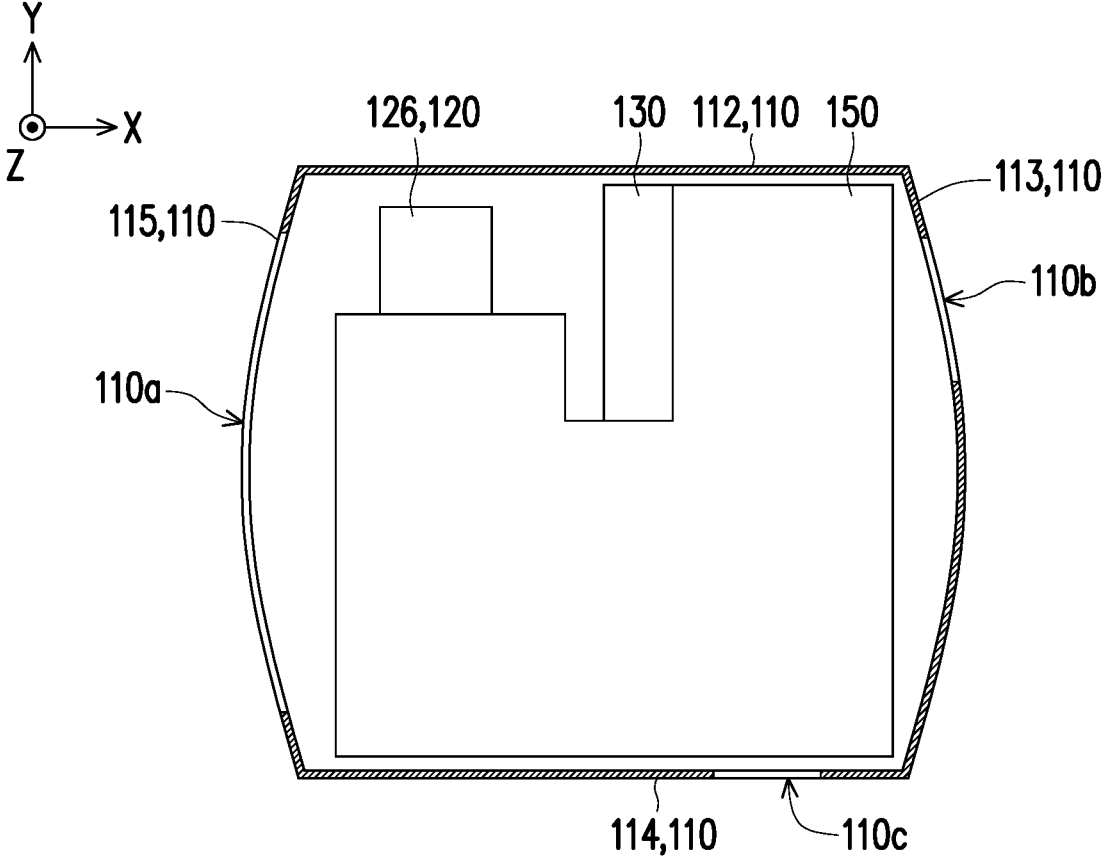
FIG. 3 is a top view of a partial structure of the projection device shown in FIG.
Figure 4:
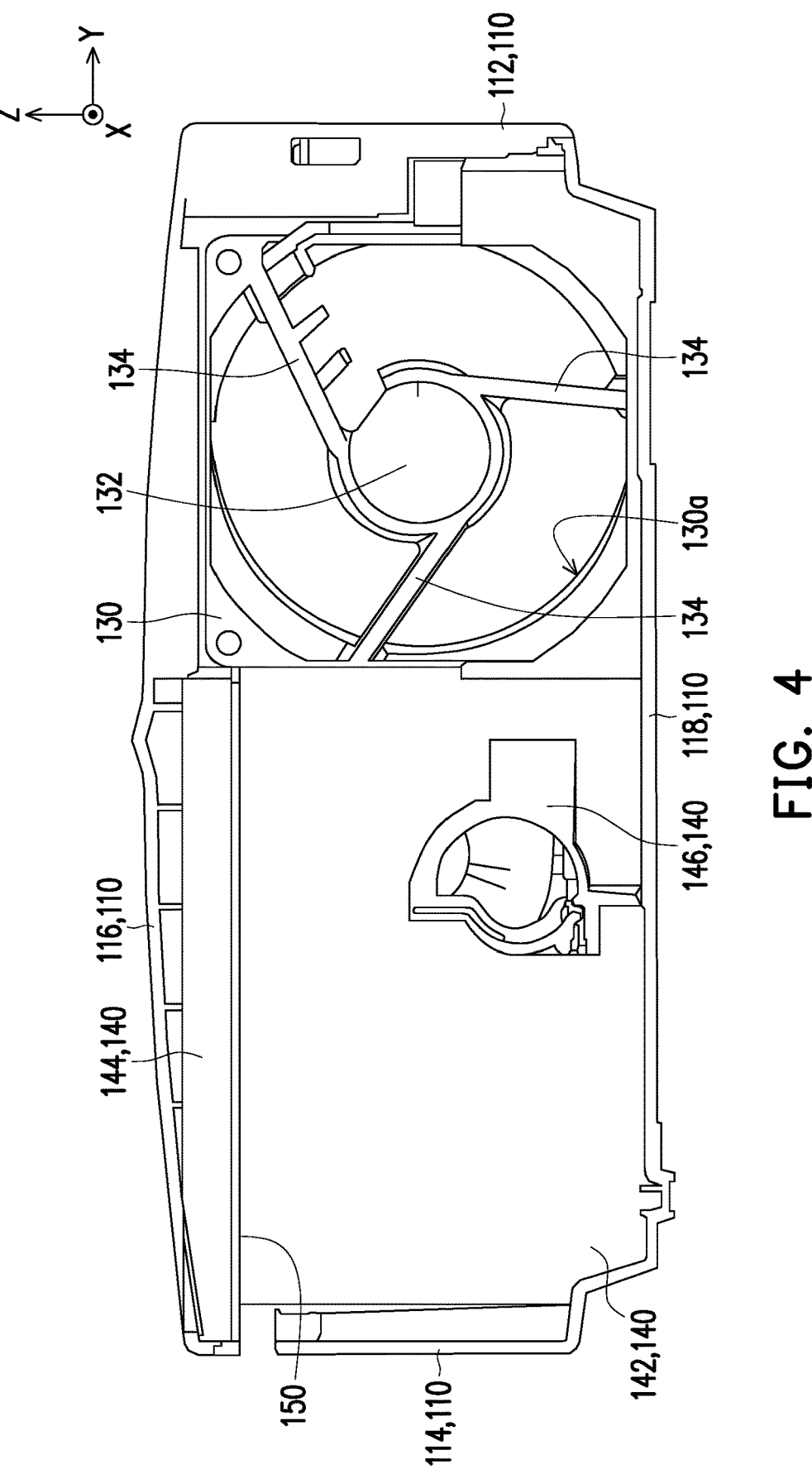
FIG. 4 is a side view of an elastic sealing member disposed on the circuit board shown in FIG. 3.
Figure 5:
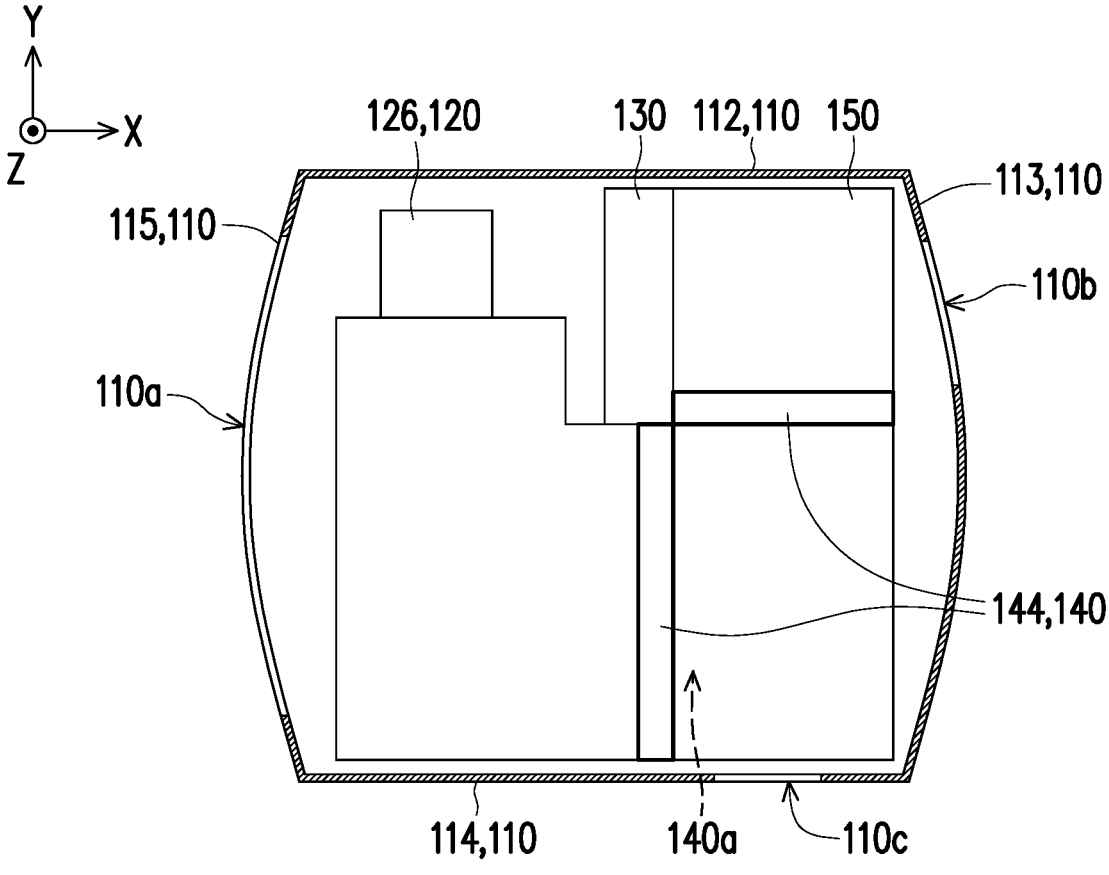
FIG. 5 is a top view of a partial structure of the projection device shown in FIG. 4.

FIG. 3 is a top view of a partial structure of the projection device shown in FIG. 1. FIG. 4 is a side view of an elastic sealing member disposed on the circuit board shown in FIG. 3. FIG. 5 is a top view of a partial structure of the projection device shown in FIG. 4. Please refer to FIG. 3 to FIG. 5. The housing 110 provided in this embodiment includes a front cover 112, a back cover 114 opposite to the front cover 112, a top cover 116, a lower cover 118 opposite to the top cover 116, and two side covers 113 and 115 opposite to each other. The air inlet 110a is located on the side cover 115, the first air outlet 110b is located on the side cover 113, the second air outlet 110c is located on the back cover 114, the side of the fan adjoins the front cover 112 of the fan 130, and the stopper wall structure 140 and the side cover 113 define the air guiding channel 140a. The projection device 100 may further include a circuit board 150 disposed in the housing 110 and located between the top cover 116 and the lower cover 118, and the distance between the circuit board 150 and the top cover 116 is, for example, less than the distance between the circuit board 150 and the lower cover 118.

In addition, as shown in FIG. 4, the stopper wall structure 140 may include a stopper wall 142, an elastic sealing member 144, and a metal member 146. The stopper wall 142 may be integrally or non-integrally connected to the lower cover 118 and located between the circuit board 150 and the lower cover 118. The elastic sealing member 144 is, for example, foam or another elastic material disposed (sandwiched) between the circuit board 150 and the top cover 116, so that the stopper wall structure 140 may reliably block and stay between the first region R1 (shown in FIG. 2) and the second region R2 (shown in FIG. 2). In addition, the metal member 146 is, for example, an existing structure in the housing 110, and the stopper wall 142 and the metal member 146 collectively constitute one part of the stopper wall structure 140 between the circuit board 150 and the lower cover 118. In another embodiment, the distance between the circuit board 150 and the lower cover 118 is less than the distance between the circuit board 150 and the top cover 116, the stopper wall 142 may be integrally or non-integrally connected to the top cover 116 and located between the circuit board 150 and the top cover 116, and the elastic sealing member 144 may be disposed (sandwiched) between the circuit board 150 and the lower cover 118. In other embodiments, the stopper wall structure 140 may only include one or two of the stopper walls 142, the elastic sealing member 144, and the metal member 146, which should not be construed as a limitation to the invention.

In this embodiment, as shown in FIG. 2, an area of the first air outlet 110b of the housing 110 is smaller than an area of the wind outlet 130a of the fan 130, so as to prevent the airflow provided by the fan 130 from being excessively exhausted from the first air outlet 110b due to the overly large size of the first air outlet 110b. As such, the amount of air flowing along the air guiding channel 140a toward the second air outlet 110c may be sufficient. The area of the wind outlet 130a is, for example, a circular area defined by the circular wind outlet 130a of the fan 130 shown in FIG. 4 or defined by subtracting an area of a region 132 which is not a wind output region and an area of three connection structures 134 from the circular area.

The location of the fan 130 in the housing 110 should not be construed as a limitation to the invention, which is elaborated below with the accompanying illustrative drawings.

Figure 6:
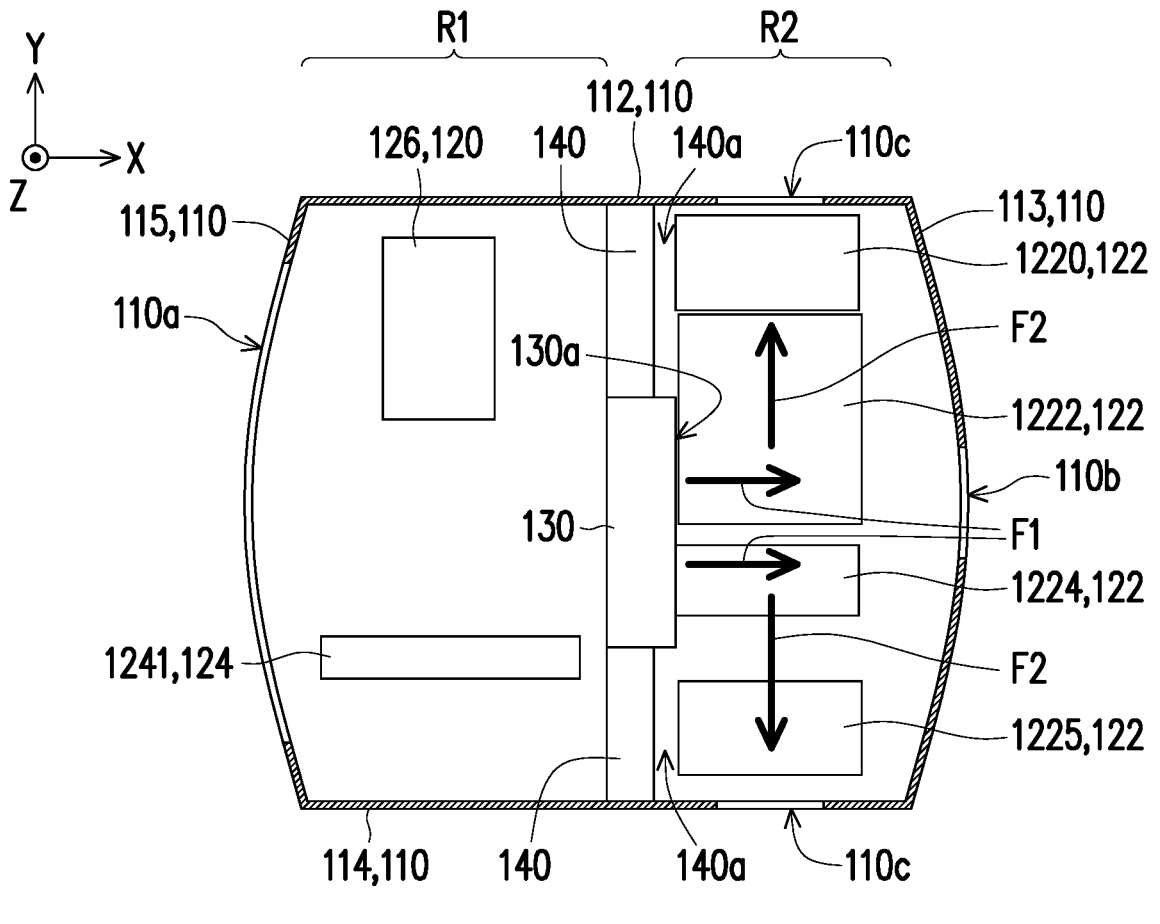
FIG. 6 is a top view of a partial structure of a projection device according to another embodiment of the invention.

FIG. 6 is a top view of a partial structure of a projection device according to another embodiment of the invention. The main difference between the embodiment shown in FIG. 6 and the embodiment shown in FIG. 2 is that the fan 130 in FIG. 6 is located at a center region between the front cover 112 and the back cover 114, and the two stopper wall structures 140 are respectively connected to the two sides of the fan 130 and extend toward the front cover 112 and the back cover 114. Correspondingly, the first heat dissipating structure 1224 is located between the front cover 112 and the back cover 114, i.e., at a region corresponding to the fan 130. In addition, the first air outlet 110b is located at the center of the side cover 113 and corresponds to the fan 130; the number of the second air outlets 110c is two, and the second air outlets 110c are located on the front cover 112 and the back cover 114, respectively. With such a configuration, the heat dissipating airflow provided by the fan 130 not only flows directly toward the first air outlet 110b (e.g., the heat dissipating airflow F1) to dissipate heat from one part of the projection module 120 (e.g., one part of the light combining assembly 1222 and the first heat dissipating structure 1224)

between the fan 130 and the first air outlet 110b, but also flows along the air guiding channel 140a toward the second air outlet 110c (e.g., the heat dissipating airflow F2) to dissipate heat from the other part of the projection module 120 (e.g., the other part of the light combining assembly 1222, the second heat dissipating structure 1225, and the driving board 1220) in the air guiding channel 140a. Thereby, one single fan 130 applied in this embodiment of the invention is capable of dissipating heat from a plurality of separate components of the projection module 120.

Figure 7:
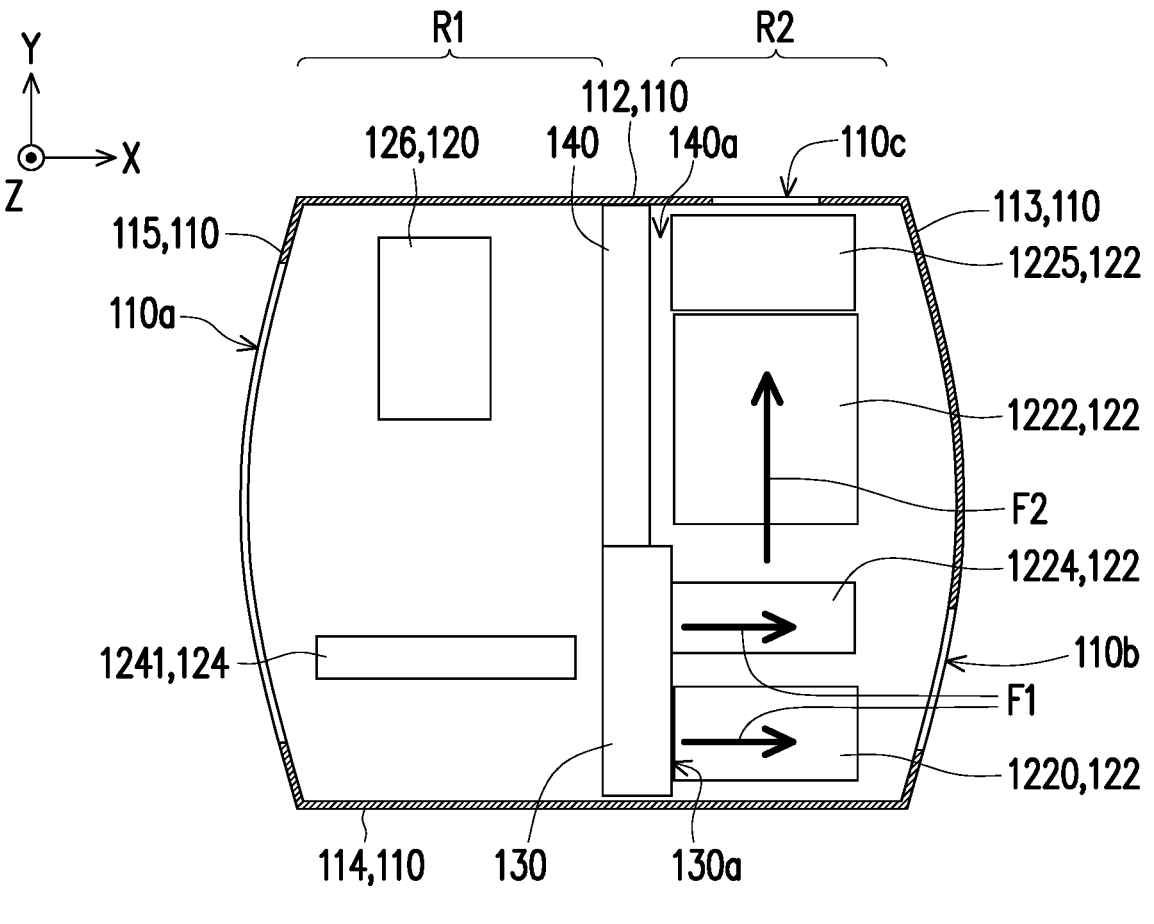
FIG. 7 is a top view of a partial structure of a projection device according to another embodiment of the invention.

FIG. 7 is a top view of a partial structure of a projection device according to another embodiment of the invention. The main difference between the embodiment shown in FIG. 7 and the embodiment shown in FIG. 2 is that the location of the fan 130 in FIG. 7 adjoins the back cover 114. Correspondingly, the location of the first heat dissipating structure 1224 adjoins the back cover 114 corresponding to the fan 130, and the stopper wall structure 140 is connected to the side of the fan 130 and extends toward the front cover 112. In addition, the first air outlet 110b is located on the side cover 113 and corresponds to the fan 130, and the second air outlet 110c is located on the front cover 112. With such a configuration, the heat dissipating airflow provided by the fan 130 not only flows directly toward the first air outlet 110b (e.g., the heat dissipating airflow F1) to dissipate heat from one part of the projection module 120 (e.g., the driving board 1220 and the first heat dissipating structure 1224) between the fan 130 and the first air outlet 110b, but also flows along the air guiding channel 140a toward the second air outlet 110c (e.g., the heat dissipating airflow F2) to dissipate heat from the other part of the projection module 120 (e.g., the light combining assembly 1222 and the second heat dissipating structure 1225) in the air guiding channel 140a. Thereby, one single fan 130 applied in this embodiment of the invention is capable of dissipating heat from a plurality of separate components of the projection module 120.

To sum up, the stopper wall structure connected to the fan is disposed in the projection device according to one or more embodiments of the invention to define the air guiding channel between the stopper wall structure and the housing. The heat dissipating airflow provided by the fan not only flows directly toward the first air outlet to dissipate heat from one part of the projection module between the fan and the first air outlet, but also flows along the air guiding channel toward the at least one second air outlet to dissipate heat from the other part of the projection module in the air guiding channel. Thereby, one single fan applied in one or more embodiments of the invention is capable of dissipating heat from a plurality of separate components of the projection module. In addition, if the housing is equipped with the circuit board adjacent to the top cover or the lower cover, the stopper wall structure may include the elastic sealing member configured to be disposed between the circuit board and the top cover or disposed between the circuit board and the lower cover, so that the stopper wall structure may reliably block hot airflows between different regions in the housing. Moreover, the area of the first air outlet of the housing may be designed to be smaller than the area of the wind outlet of the fan, so as to prevent the airflow provided by the fan from being excessively exhausted from the first air outlet due to the overly large size of the first air outlet. As such, the amount of air flowing along the air guiding channel toward the second air outlet may be guaranteed to be sufficient.

The foregoing description of the preferred of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection device, comprising a housing, a projection module, a fan, and at least one stopper wall structure, wherein:

the housing has an air inlet, a first air outlet, and at least one second air outlet;

the projection module is disposed in the housing;

the fan is disposed in the housing, and the fan has a wind outlet, wherein the wind outlet faces the first air outlet, one part of the projection module is located between the wind outlet and the first air outlet, and one part of a heat dissipating airflow provided by the fan flows from the wind outlet to the first air outlet; and the at least one stopper wall structure is connected to the fan, wherein the at least one stopper wall structure and one part of the housing define at least one air guiding channel, the other part of the projection module is located in the at least one air guiding channel, and the other part of the heat dissipating airflow provided by the fan is guided by the at least one air guiding channel to flow toward the at least one second air outlet, wherein the heat dissipating airflow flows along a wind output direction from the wind outlet of the fan, and an extension line of the wind output direction does not intersect the at least one stopper wall structure.

2. The projection device according to claim 1, wherein an area of the first air outlet is smaller than an area of the wind outlet of the fan.

3. The projection device according to claim 1, wherein the projection module comprises a light source module, a light valve, and a projection lens, the light source module is configured to provide an illumination beam, the light valve is configured to convert the illumination beam to an image beam, the projection lens is configured to project the image beam out of the housing, one part of the light source module is located between the wind outlet and the first air outlet, and the other part of the light source module is located in the at least one air guiding channel.

4. The projection device according to claim 3, wherein the light source module comprises a driving board, a light source, a light combining assembly, a rotation wheel, a first heat dissipating structure, and a second heat dissipating structure, the driving board is connected to the light source, the light source is configured to provide the illumination beam, the illumination beam is sequentially transmitted to the light combining assembly and the rotation wheel and is transmitted toward the light valve, the first heat dissipating structure and the second heat dissipating structure are respectively connected to the light source and the rotation wheel, at least one of the driving board, the light combining assembly, the first heat dissipating structure, and the second heat dissipating structure is located between the wind outlet and the first air outlet, and at least the other of the driving board, the light combining assembly, the first heat dissipating structure, and the second heat dissipating structure is located in the at least one air guiding channel.

5. The projection device according to claim 4, wherein one of the first heat dissipating structure and the second heat dissipating structure is located between the wind outlet and the first air outlet, and the other of the first heat dissipating structure and the second heat dissipating structure is located in the at least one air guiding channel.

6. The projection device according to claim 3, wherein the fan and the at least one stopper wall structure divide the housing into a first region and a second region, the air inlet, the projection lens, and the light valve are located in the first region, and the first air outlet, the at least one second air outlet, and the light source module are located in the second region.

7. The projection device according to claim 1, wherein the at least one stopper wall structure extends from a side of the fan.

8. The projection device according to claim 1, wherein an extension direction of the at least one stopper wall structure is perpendicular to the wind output direction of the fan.

9. The projection device according to claim 1, wherein the housing comprises a front cover, a back cover opposite to the front cover, a top cover, a lower cover opposite to the top cover, and two side covers opposite to each other, the air inlet is located at one of the two side covers, the first air outlet is located at the other of the two side covers, and the at least one second air outlet is located at one of the front cover and the back cover or located at both of the front cover and the back cover.

10. The projection device according to claim 9, wherein the fan adjoins the front cover or the back cover.

11. The projection device according to claim 9, wherein the at least one stopper wall structure is integrally connected to at least one of the top cover and the lower cover.

12. The projection device according to claim 9, wherein the projection device comprises a circuit board, the circuit board is disposed in the housing, the at least one stopper wall structure comprises an elastic sealing member, and the elastic sealing member is disposed between the circuit board and the top cover or disposed between the circuit board and the lower cover.

13. The projection device according to claim 9, wherein the at least one stopper wall structure and one of the two side covers define the at least one air guiding channel.

14. The projection device according to claim 1, wherein the at least one stopper wall structure comprises at least one of an elastic sealing member and a metal member.

15. A projection device, comprising a housing, a projection module, a fan, and at least one stopper wall structure, wherein:

the housing has an air inlet, a first air outlet, and at least one second air outlet;

the projection module is disposed in the housing, and the projection module comprises a light source module, a light valve, and a projection lens, wherein:

the light source module is configured to provide an illumination beam, the light source module comprises a driving board, a light source, a light combining assembly, a rotation wheel, a first heat dissipating structure, and a second heat dissipating structure, the driving board is connected to the light source, the light source is configured to provide the illumination beam, the illumination beam is sequentially transmitted to the light combining assembly and the rotation wheel and is transmitted toward the light valve, the first heat dissipating structure and the second heat dissipating structure are respectively connected to the light source and the rotation wheel, and the light valve is configured to convert the illumination beam to an image beam; and the projection lens is configured to project the image beam out of the housing, the fan is disposed in the housing, and the fan has a wind outlet, wherein the wind outlet faces the first air outlet, at least one of the driving board, the light combining assembly, the first heat dissipating structure, and the second heat dissipating structure is located between the wind outlet and the first air outlet, and one part of a heat dissipating airflow provided by the fan flows from the wind outlet to the first air outlet; and the at least one stopper wall structure is connected to the fan, wherein the at least one stopper wall structure and one part of the housing define at least one air guiding channel, the at least the other of the driving board, the light combining assembly, the first heat dissipating structure, and the second heat dissipating structure is located in the at least one air guiding channel, and the other part of the heat dissipating airflow provided by the fan is guided by the at least one air guiding channel to flow toward the at least one second air outlet.

16. A projection device, comprising a housing, a projection module, a fan, and at least one stopper wall structure, wherein:

the housing has an air inlet, a first air outlet, and at least one second air outlet;

the projection module is disposed in the housing, and the projection module comprises a light source module, a light valve, and a projection lens, the light source module is configured to provide an illumination beam, the light valve is configured to convert the illumination beam to an image beam, and the projection lens is configured to project the image beam out of the housing, the fan is disposed in the housing, and the fan has a wind outlet, wherein the wind outlet faces the first air outlet, one part of the light source module is located between the wind outlet and the first air outlet, and one part of a heat dissipating airflow provided by the fan flows from the wind outlet to the first air outlet; and the at least one stopper wall structure is connected to the fan, wherein the at least one stopper wall structure and one part of the housing define at least one air guiding channel, the other part of the light source module is located in the at least one air guiding channel, and the other part of the heat dissipating airflow provided by the fan is guided by the at least one air guiding channel to flow toward the at least one second air outlet, wherein the fan and the at least one stopper wall structure divide the housing into a first region and a second region, the air inlet, the projection lens, and the light valve are located in the first region, and the first air outlet, the at least one second air outlet, and the light source module are located in the second region.

17. A projection device, comprising a housing, a circuit board, a projection module, a fan, and at least one stopper wall structure, wherein:

the housing has an air inlet, a first air outlet, and at least one second air outlet, wherein the housing comprises a front cover, a back cover opposite to the front cover, a top cover, a lower cover opposite to the top cover, and two side covers opposite to each other, the air inlet is located at one of the two side covers, the first air outlet is located at the other of the two side covers, and the at least one second air outlet is located at the front cover or/and the back cover;

the circuit board is disposed in the housing;

the projection module is disposed in the housing;

the fan is disposed in the housing, and the fan has a wind outlet, wherein the wind outlet faces the first air outlet, one part of the projection module is located between the wind outlet and the first air outlet, and one part of a heat dissipating airflow provided by the fan flows from the wind outlet to the first air outlet; and the at least one stopper wall structure is connected to the fan, wherein the at least one stopper wall structure and one part of the housing define at least one air guiding channel, the other part of the projection module is located in the at least one air guiding channel, and the other part of the heat dissipating airflow provided by the fan is guided by the at least one air guiding channel to flow toward the at least one second air outlet, wherein the at least one stopper wall structure further comprises an elastic sealing member, and the elastic sealing member is disposed between the circuit board and the top cover or disposed between the circuit board and the lower cover.

* * * * *